(12) United States Patent
Anderson et al.

(10) Patent No.: US 7,550,808 B2
(45) Date of Patent: Jun. 23, 2009

(54) FULLY SILICIDING REGIONS TO IMPROVE PERFORMANCE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 11/624,324

(22) Filed: Jan. 18, 2007

(65) Prior Publication Data
US 2008/0173953 A1 Jul. 24, 2008

(51) Int. Cl.
*H01L 29/78* (2006.01)
*H01L 21/3205* (2006.01)

(52) U.S. Cl. ............... 257/384; 257/296; 257/E21.266

(58) Field of Classification Search ............... 257/390, 257/520, 296, 471; 437/195; 438/257, 586
See application file for complete search history.

(56) References Cited

U.S. PATENT DOCUMENTS

| | | | |
|---|---|---|---|
| 5,268,330 A * | 12/1993 | Givens et al. ............... | 438/586 |
| 6,160,291 A | 12/2000 | Imai | |
| 6,437,404 B1 | 8/2002 | Xiang et al. | |
| 6,613,614 B2 | 9/2003 | Yamazaki et al. | |
| 7,033,868 B2 | 4/2006 | Nakamura et al. | |
| 7,238,569 B2 * | 7/2007 | Torii ........................ | 438/257 |
| 2005/0156238 A1 | 7/2005 | Wen et al. | |
| 2005/0250287 A1 | 11/2005 | Chen et al. | |
| 2006/0125040 A1 * | 6/2006 | Levin et al. ............... | 257/471 |
| 2006/0175649 A1 * | 8/2006 | Bhattacharyya ............ | 257/296 |
| 2007/0170543 A1 * | 7/2007 | Furukawa et al. ........... | 257/520 |

* cited by examiner

*Primary Examiner*—N Drew Richards
*Assistant Examiner*—Mamadou Diallo
(74) *Attorney, Agent, or Firm*—Anthony J. Canale; Hoffman Warnick LLC

(57) ABSTRACT

Structures and related methods including fully silicided regions are disclosed. In one embodiment, a structure includes a substrate; a partially silicided region located in an active region of an integrated circuit formed on the substrate; a fully silicided region located in a non-active region of the integrated circuit, and wherein the partially and fully silicided regions are formed from a common semiconductor layer.

15 Claims, 11 Drawing Sheets

FULLY SILICIDING REGIONS TO IMPROVE PERFORMANCE

BACKGROUND OF THE INVENTION

1. Technical Field

The invention relates generally to integrated circuit (IC) chip fabrication, and more particularly, to structures including fully silicided regions and related methods.

2. Background Art

In the semiconductor industry, device performance improvements are becoming more difficult to achieve as size is further miniaturized.

SUMMARY OF THE INVENTION

Structures including fully silicided regions and related methods are disclosed. In one embodiment, a structure includes a substrate; a partially silicided region located in an active region of an integrated circuit formed on the substrate; and a fully silicided region located in a non-active region of the integrated circuit, and wherein the partially and fully silicided regions are formed from a common semiconductor layer.

A first aspect of the invention provides a structure comprising: a substrate; a partially silicided region located in an active region of an integrated circuit formed on the substrate; a fully silicided region located in a non-active region of the integrated circuit; and wherein the partially and fully silicided regions are formed from a common semiconductor layer.

A second aspect of the invention provides a structure comprising: a substrate; a first field effect transistor (FET) on the substrate; a second FET on the substrate; and a fully silicided region positioned in the substrate between adjacent source/drain regions of the first FET and the second FET.

A third aspect of the invention provides a method comprising: forming a polysilicon layer over at least one active silicon region in a dielectric layer; partially siliciding a first region of the polysilicon layer over the at least one active silicon region; and fully siliciding a second region of the polysilicon layer over a non-active silicon region.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 11, 12 and 14-18 show one embodiment of a method of forming the structure of FIG. 5.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
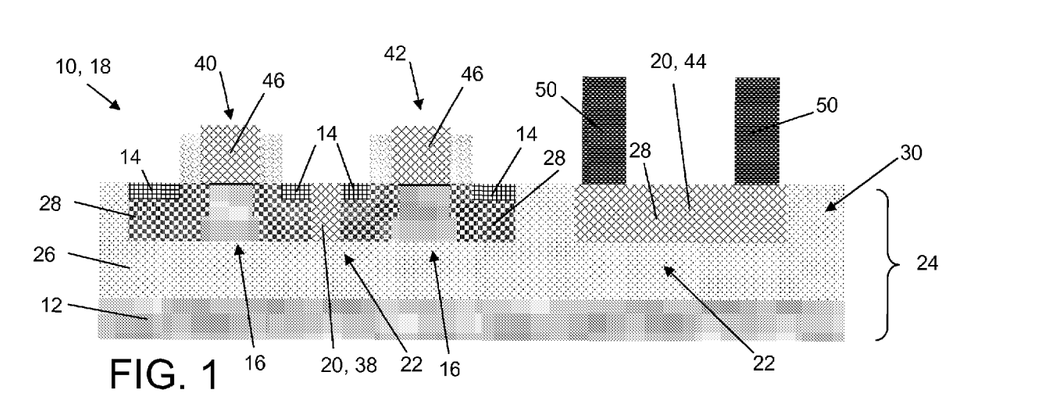
FIG. 1 shows a cross-sectional view of a first embodiment of a structure.
Figure 2:
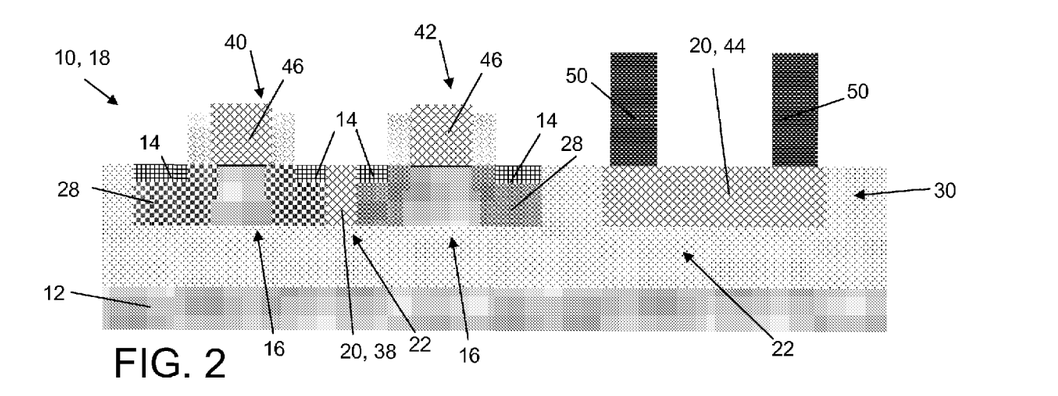
FIG. 2 shows a cross-sectional view of a second embodiment of a structure.
Figure 3:
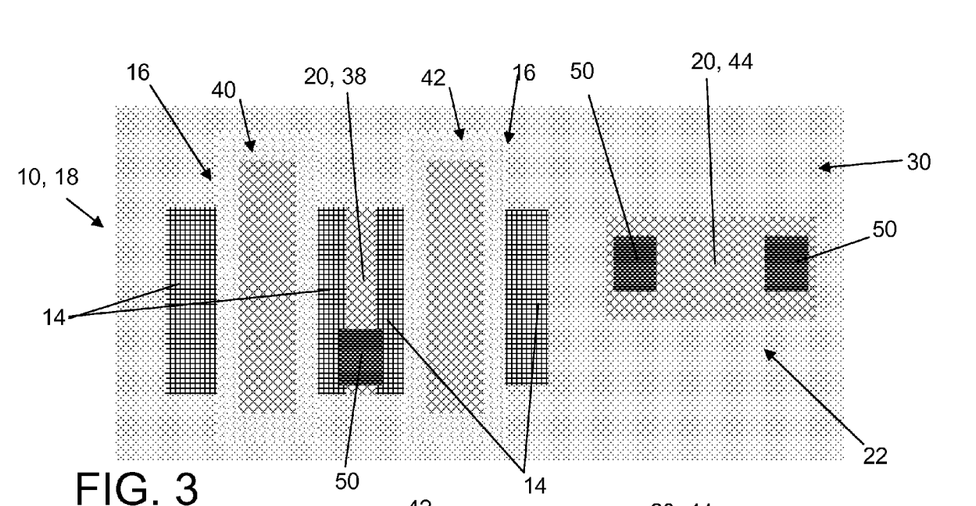
FIG. 3 shows a top view of the second embodiment of the structure including vias.

Referring to FIGS. 1-5, various embodiments of a structure 10 including a fully silicided region 20 are disclosed. FIG. 3 shows a top view of FIG. 4. Each embodiment includes a substrate 12, 112 (e.g., silicon), a partially silicided region 14, 114 located in an active region 16, 116 of an integrated circuit (IC) 18, 118 formed on substrate 12, 112, and a fully silicided region 20, 120 located in a non-active region 22, 122 of IC 18, 118. In addition, in each embodiment, partially silicided region 14, 114 and fully silicided region 20, 120 are formed from a common semiconductor layer 30, 130, e.g., polysilicon, silicon germanium, etc. (Note, that although both are silicide, regions 14, 114 and 20, 120 are shown with different cross-hatching for differentiation purposes only.)

In the following description, as shown for example in FIGS. 1 and 5 only, structure 10 may be formed over a semiconductor-on-insulator (SOI) wafer 24 having silicon substrate 12, 112, a buried insulator layer 26, 126 and semiconductor regions 28 of semiconductor layer 30 formed in buried insulator layer 26. It is understood, however, that the teachings of the invention are not limited to that type of substrate. That is, a bulk silicon substrate may also be employed. In this case, as one with skill in the art will recognize, there would be no difference between buried insulator layer 26, 126 and silicon substrate 12, 112, and semiconductor regions 28 would not be defined within buried insulator layer 26, 126, but rather a bulk silicon substrate.

Referring to FIGS. 1-4, in these embodiments, fully silicided region 20 may be provided in a number of locations. First, fully silicided region 38 may be positioned between adjacent source/drain regions (active regions) 16 of first and second field effect transistors (FETs) 40, 42. In FIG. 1, FETs 40, 42 are both nFETs, as indicated by the common cross-hatching of active regions 16 of both FETs. As a result, fully silicided region 38 between adjacent source/drain regions 16 acts as an interconnect, and reduces body-to-body leakage, and hence serves as an isolation region between the bodies of the two FETs 40, 42. In FIG. 2, one of the FETs is a pFET 42 and the other is an nFET 40, as indicated by the different cross-hatching of active regions 16 of both FETs. In this case, fully silicided region 38 between adjacent source/drain regions 16 of FETs 40, 42 acts as a butted junction, which improves the n+-to-p+ connection and the nFET-body-to-pFET-body isolation. Another fully silicided region may provide a wiring region 44 that acts as an interconnect within polysilicon layer 30. During formation, silicidation may also form fully silicided gate conductors 46 in FETs 40, 42. In these embodiments, partially silicided regions 14 are provided in source/drain regions 16. Silicided regions 14, 20 may include any now known or later developed silicide, e.g., cobalt silicide, nickel silicide, etc.

Figure 4:
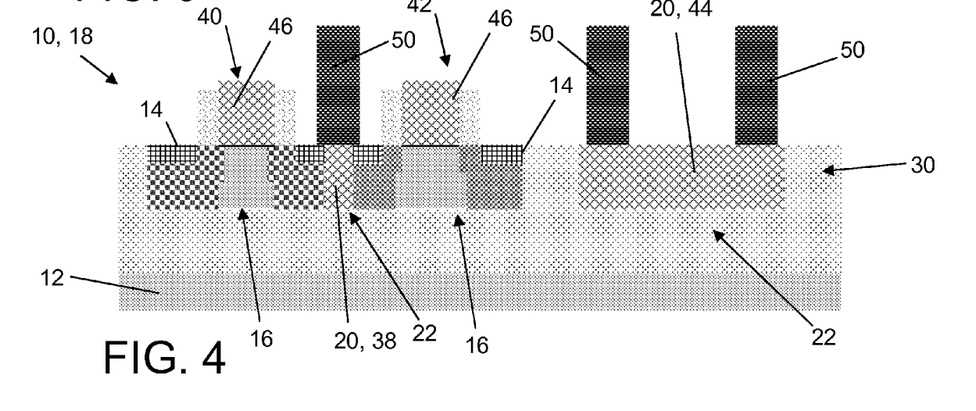
FIG. 4 shows a cross-sectional view of FIG. 3.

FIGS. 3-4 illustrate how structure 10 reduces the number of vias 50 required, e.g., only one via is required to contact fully silicided region 38, which reduces capacitance. That is, only one via is required to contact fully silicided region 38 rather than two for each partially silicided region 14 in adjacent source/drain regions 16 of each FET 40, 42.

Figure 5:
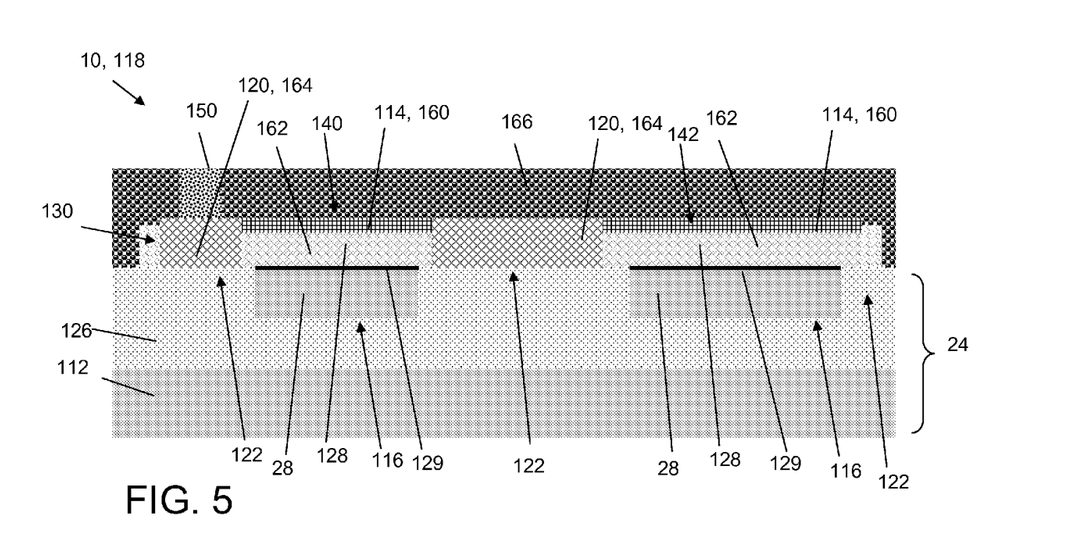
FIG. 5 shows a cross-sectional view of a third embodiment of a structure.

Turning to FIG. 5, another embodiment may include a substrate 112 (e.g., silicon), a partially silicided region 114 located in an active region 116 of an integrated circuit (IC)

118 formed on substrate 112, and a fully silicided region 120 located in a non-active region 122 of IC 118. As a result, transistors 140, 142 with partially silicide gate conductors 160 are provided. In addition, partially silicided region 114 and fully silicided region 120 are formed from a common semiconductor layer 130, e.g., polysilicon, silicon germanium, etc. In this case, partially silicided region 114 includes a gate conductor(s) 160 over a remaining portion 162 of semiconductor layer 130, and fully silicided region 114 includes an interconnect 164 coupling partially silicided gate conductor(s) 160. Hence, structure 10 in this embodiment provides a continuous gate 160,164 that is fully silicided in a non-active region 122 and is partially silicided 114 over an active region 116. A dielectric layer 166 is also shown provided over structure 10 in this embodiment. Dielectric layer 166 may include, for example, silicon oxide, silicon nitride or a combination thereof. Although many vias be provided, only one via 150 is shown extending through dielectric layer 166.

Turning to FIGS. 6-19, various embodiments of methods of forming the above-described structures 10 are shown. In any event, each embodiment includes forming a polysilicon layer 30, 130 over at least one active silicon region 16, 116 in a dielectric layer 26, 126, partially siliciding a first region 14, 114 of polysilicon layer 30, 130 over the at least one active silicon region 16, 116; and fully siliciding a second region 20, 120 of polysilicon layer 30, 130 over a non-active silicon region 22, 122.

Figure 6:
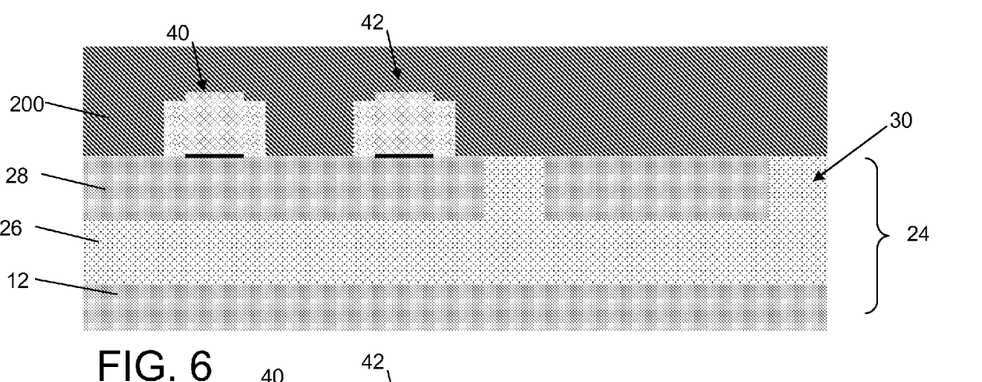
FIGS. 6-11 shows one embodiment of a method of forming the structure of FIGS. 1-4.
Figure 7:
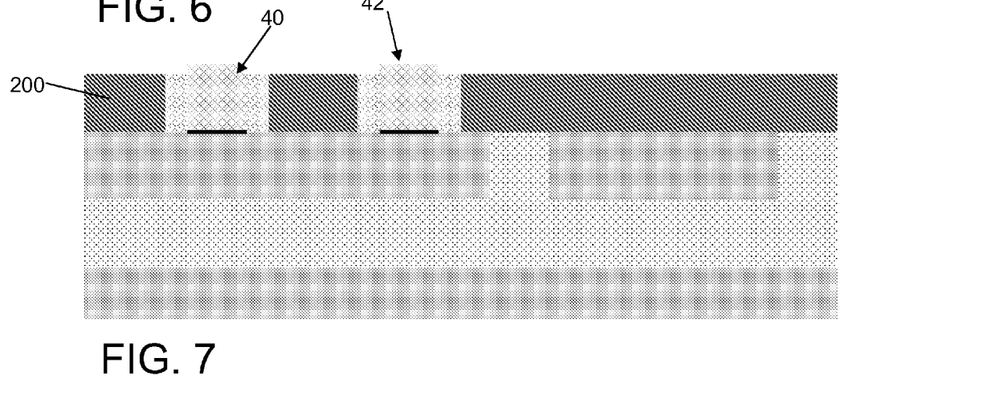

FIGS. 6-10 show one illustrative method of forming structure 10 as shown in FIGS. 1-4. In FIG. 6, a semiconductor-on-insulator (SOI) substrate 24 is provided having a semiconductor region(s) 28 (e.g., polysilicon, silicon germanium, etc.) of semiconductor layer 30 defined in a buried insulator layer 26 (e.g., silicon oxide) over a substrate 12 (e.g., silicon). Transistors 40, 42 are shown already formed over SOI substrate 24, and a hardmask 200 is formed. Hardmask 200 may include, for example, a silicon dioxide hardmask, or silicon nitride hardmask. The above-described structure may be formed using any now known or later developed techniques. In FIG. 7, hardmask 200 is etched back to reveal the tops of transistors 40, 42.

Figure 8:
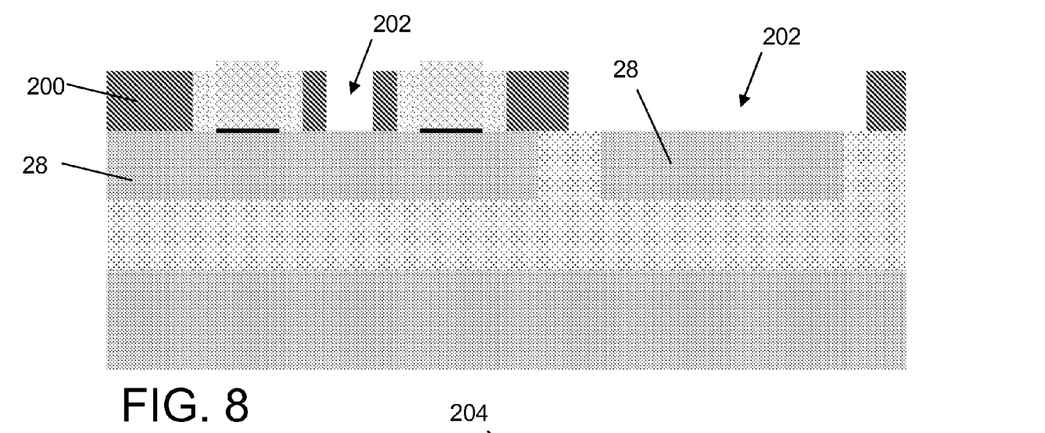
Figure 9:
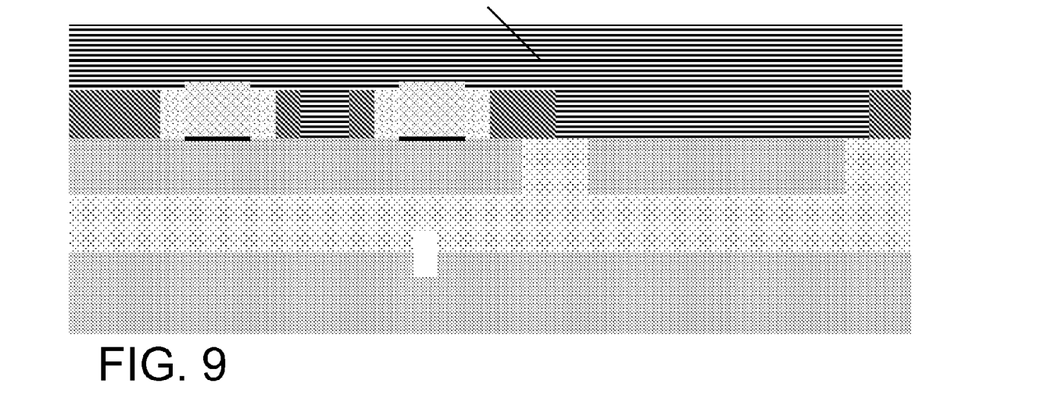
Figure 10:
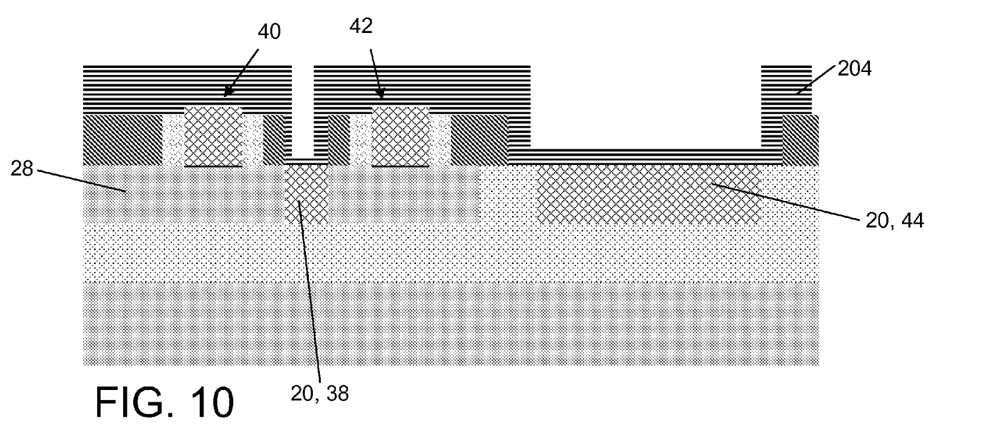

In FIG. 8, a photoresist (not shown) is deposited, patterned and etched to remove hardmask 200 to expose areas 202 of semiconductor regions 28 to be fully silicided. In FIG. 9, a metal layer 204, e.g., cobalt, nickel, etc., is deposited, and in FIG. 10 metal layer 204 is annealed so as to fully consume semiconductor regions 28 where exposed. Metal layer 204 is of sufficient depth to allow for full silicidation. Fully silicided regions 20 are the result. As noted above, where FETs 40, 42 are nFETs, fully silicided region 20 acts as an interconnection region 38, and where FETs 40, 42 are different, i.e., one is an nFET and the other is a pFET, fully silicide region 20 acts as a butted junction 38. Next, metal layer 204 and hardmask 200 may be removed (as shown FIGS. 1-4) in any now known or later developed manner, e.g., a wet etch. As shown in FIGS. 3 and 4, subsequent conventional processing (e.g., photolithography and conductor deposition), may provide vias 50 to fully silicided regions 20. As noted above, fully silicided region 44 (FIGS. 3, 4, 10) may act as a wiring region in some embodiments.

Figure 11:
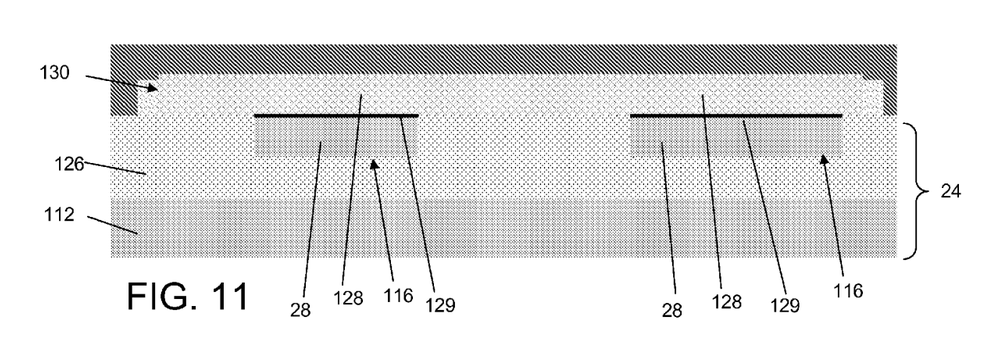

FIGS. 11-19 show illustrative methods of forming structure 10 as shown in FIG. 5. In FIG. 11, a semiconductor-on-insulator (SOI) substrate 24 is provided having a semiconductor regions 28 (e.g., polysilicon, silicon germanium, etc.) defined in a buried insulator layer 126 (e.g., silicon oxide) over a substrate 112 (e.g., silicon). In this case, however, a semiconductor layer 130 is defined over SOI substrate 24 and semiconductor regions 128 are defined over semiconductor regions 28, which may be separated by a dielectric 129 (e.g., silicon oxide), which will eventually function as a gate dielectric.

Figure 12:
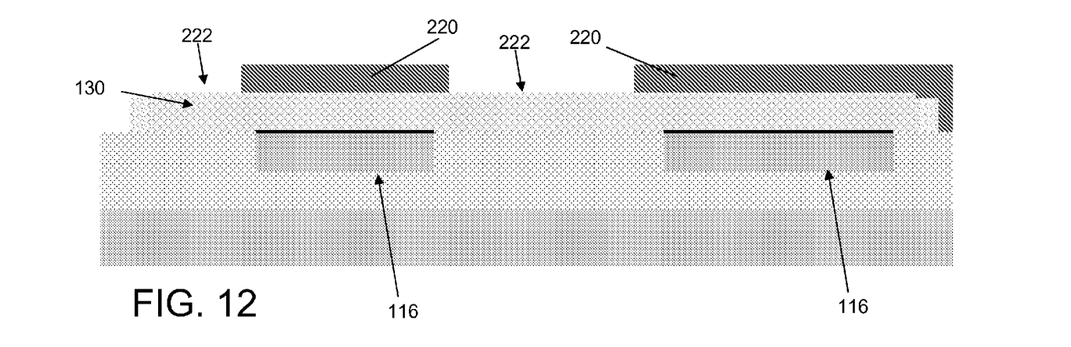
Figure 13:
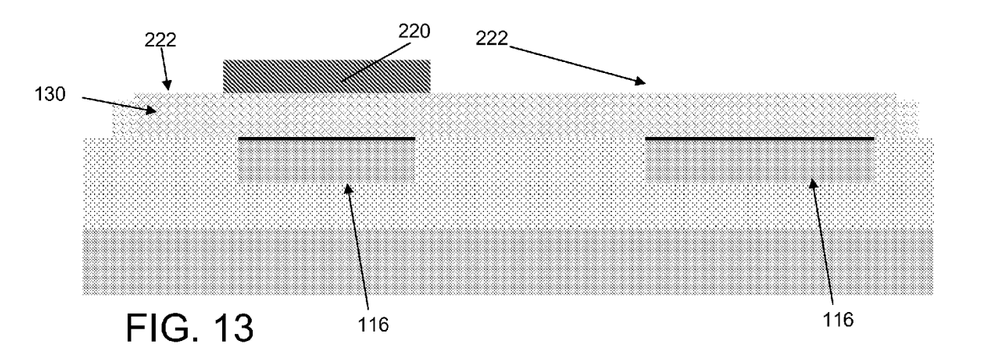
FIGS. 13 and 19 shows an alternative embodiment to that of FIGS. 5, 11, 12 and 14-18.

In FIG. 12, a hardmask 220 is deposited and patterned (e.g., using a photoresist (not shown), patterned and etched) to reveal areas 222 of semiconductor layer 130 to be fully silicided. As shown in FIG. 12, hardmask 220 remains over both active regions 116. As a result, as described hereafter, transistors 140, 142 (FIG. 5) formed over active regions 116 will include only partially silicided gates. As shown in FIG. 13, however, hardmask 220 may be patterned so as to selectively expose areas 222 over active regions 116 also such that fully silicided gates may be formed, as further described herein.

Figure 14:
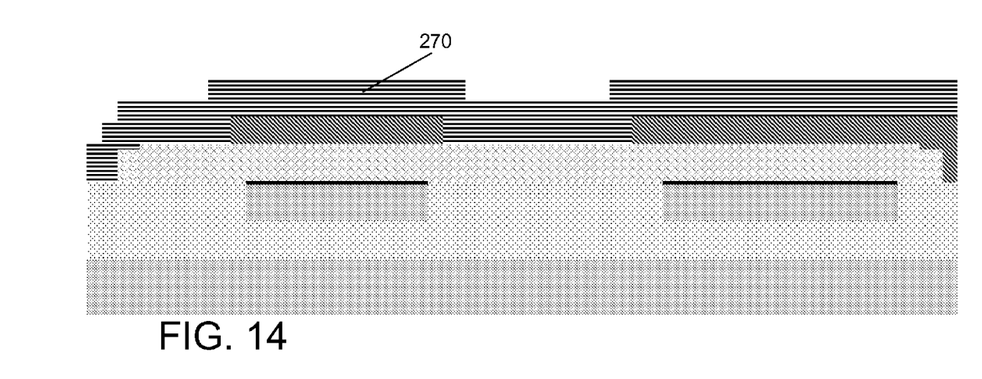
Figure 15:
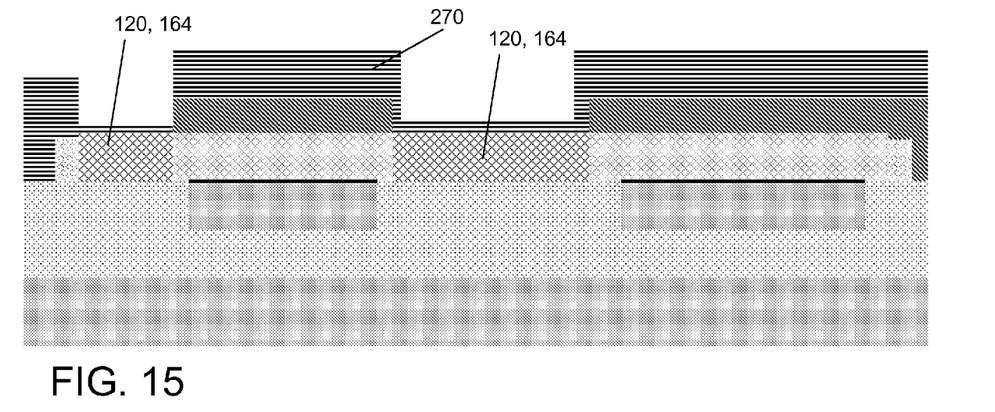
Figure 16:
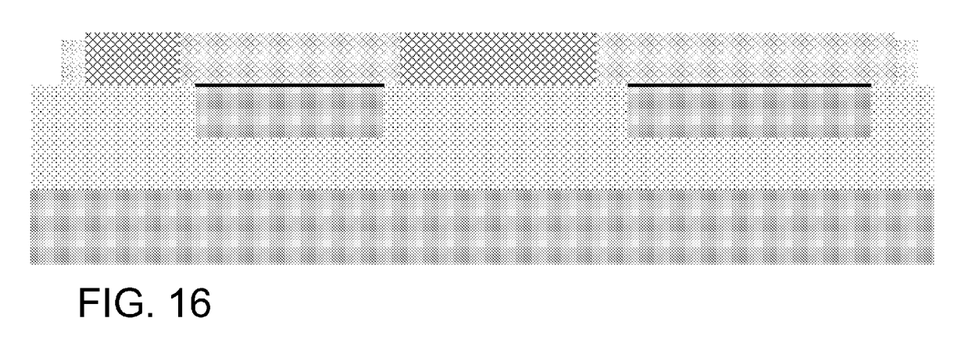
Figure 17:
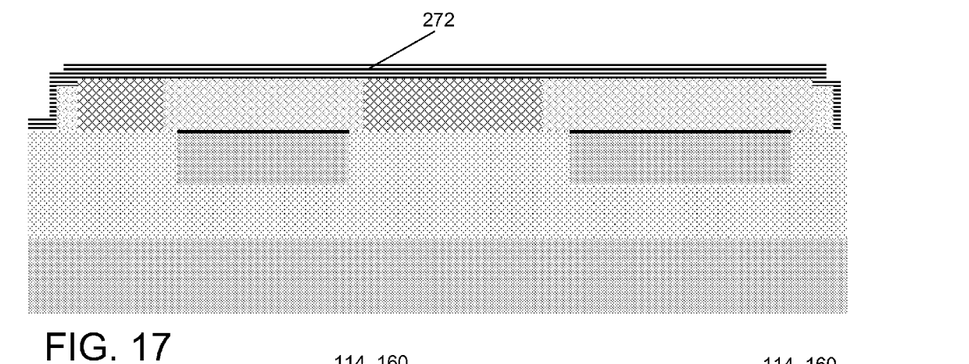
Figure 18:
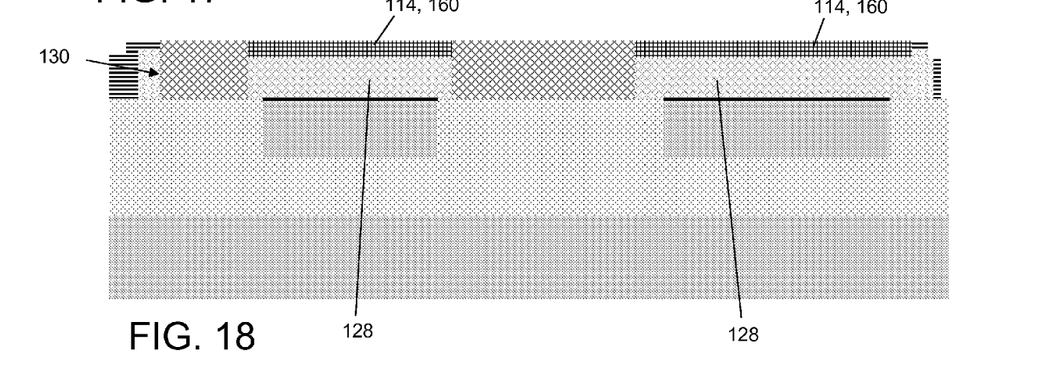

Continuing with processing from FIG. 12, FIG. 14 shows deposition of a metal layer 270 (e.g., cobalt, nickel, etc.), and FIG. 15 shows annealing to form fully silicided regions 120. Metal layer 270 is sufficiently thick to allow complete silicidation of semiconductor layer 130 where exposed. FIG. 16 shows the structure after selective etch removal of unreacted metal layer 270 (FIG. 15) and hard mask 220 (FIG. 13). FIG. 17 shows deposition of a thin metal layer 272 (e.g., cobalt, nickel, etc.), and FIG. 18 shows annealing to form partially silicided regions 114. Metal layer 272 is only thick enough to allow partial silicidation of regions 128 of semiconductor layer 130.

Figure 19:
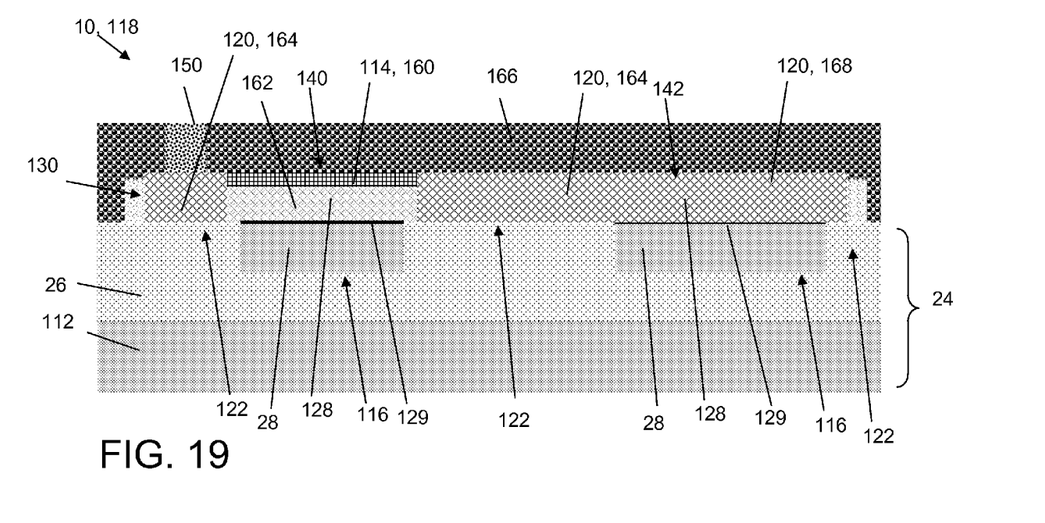

Subsequently, as shown in FIG. 5, unreacted metal layer 272 (FIG. 17) is removed, dielectric layer 166 is deposited and via(s) 150 are formed. FIG. 5 shows structure 10 including fully silicided region(s) gate conductor 160. If, however, as shown in FIG. 19, processing continued from the structure shown in FIG. 13, structure 10 may include partially silicided gate conductor 160 and a fully silicided gate conductor 168.

Although illustrative methods of forming the structures 10 have been described herein, it is understood that various other techniques may also be employed and are considered within the scope of the invention.

The structures and methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:
1. A structure comprising:
   a substrate;
   a partially silicided region located in an active region of an integrated circuit formed on the substrate, wherein the partially silicided region is located in a source/drain region of a first field effect transistor (FET) and a source/drain region of a second field effect transistor (FET);

a fully silicided region located in a non-active region of the integrated circuit, wherein the fully silicided region is located in an interconnect region between the first FET and the second FET, the fully silicided region interconnecting the partially silicided region located in the source/drain region of the first FET and the source/drain region of the second FET; and wherein the partially and fully silicided regions are formed from a common semiconductor layer.

2. The structure of claim 1, wherein the fully silicided region includes a butted junction located between the source/drain regions of the first FET and the second FET.

3. The structure of claim 2, wherein one of the first and second FETs is a pFET and the other is an nFET.

4. The structure of claim 1, wherein the partially silicided region includes a gate conductor.

5. The structure of claim 1, wherein the interconnect region couples partially silicided gate conductors.

6. A structure comprising:
a substrate;
a first field effect transistor (FET) on the substrate;
a second field effect transistor (FET) on the substrate;
a partially silicided region located in a source/drain region of the first FET and a source/drain region of the second FET: and
a fully silicided region positioned in the substrate in an interconnect region between the first FET and the second FET, the fully silicided region interconnecting the partially silicided region located in the source/drain region of the first FET and the source/drain region of the second FET, the fully silicided region acting as an isolation region between active regions of the first FET and second FET.

7. The structure of claim 6, wherein one of the first and second FETs is a pFET and the other is an nFET.

8. The structure of claim 6, wherein each of the first and second FET is an nFET.

9. The structure of claim 8, wherein the fully silicided region interconnects acts as an interconnect between active regions of the first and second FET.

10. The structure of claim 6, further comprising a fully silicided wiring region adjacent to the first and second FET.

11. A method comprising:
forming a polysilicon layer over at least one active silicon region in a dielectric layer;
partially siliciding a first region of the polysilicon layer over the at least one active silicon region;
fully siliciding a second region of the polysilicon layer over a non-active silicon region; and
wherein the fully silicided second region interconnects with the partially silicided first region.

12. The method of claim 11, wherein the fully silicided second region includes a gate conductor.

13. The method of claim 11, wherein the fully silicided second region includes a region between active regions of a pair of field effect transistors.

14. The method of claim 11, wherein the fully silicided second region includes a wiring region.

15. The method of claim 11 wherein the partially silicided first region includes a gate conductor.

* * * * *